US007380197B1

(12) United States Patent
Goolsby

(10) Patent No.: US 7,380,197 B1
(45) Date of Patent: May 27, 2008

(54) CIRCUIT AND METHOD FOR ERROR DETECTION

(75) Inventor: Jeremy B. Goolsby, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 555 days.

(21) Appl. No.: 11/179,446

(22) Filed: Jul. 12, 2005

(51) Int. Cl.
*H03M 13/00* (2006.01)

(52) U.S. Cl. .................................... 714/758
(58) Field of Classification Search ........... 714/752, 714/746, 758
See application file for complete search history.

(56) References Cited

U.S. PATENT DOCUMENTS 6,041,430 A * 3/2000 Yamauchi ................. 714/752
7,061,407 B1    6/2006 Lee

* cited by examiner

*Primary Examiner*—Shelly A Chase
(74) *Attorney, Agent, or Firm*—LeRoy D. Maunu

(57) ABSTRACT

A circuit and method efficiently provide detection of corruption of data using an error correcting code (ECC). The circuit includes an ECC checker, a memory arrangement, and a detection circuit. The ECC checker generates a remainder of an ECC check of the data and an ECC value generated from an uncorrupted version of the data. The memory stores a set of values and receives a first portion of the remainder at a first address port and a second portion of the remainder at a second address port. The memory arrangement outputs a first value of the set responsive to a value of the first portion and output a second value of the set responsive to a value of the second portion. The detection circuit generates an error indication in response to the first and second values to indicate whether a single bit of the data is incorrect.

20 Claims, 6 Drawing Sheets

| Bit index with error | CRC remainder | Port A address | Data at A address | Port B address | Data at B address |
|---|---|---|---|---|---|
| none | 0x0000 | 0x000 | 0xA0 | 0x700 | 0xA0 |
| data/31 | 0xDD38 | 0x618 | 0x8F | 0x7DF | 0xCF |
| data/30 | 0x6E9C | 0x3CC | 0x8E | 0x76D | 0xCE |
| data/29 | 0x374E | 0x1AE | 0x8D | 0x736 | 0xCD |
| data/28 | 0x1BA7 | 0x0D7 | 0x8C | 0x71A | 0xCC |
| data/27 | 0x85C3 | 0x463 | 0x8B | 0x786 | 0xCB |
| data/26 | 0xCAF1 | 0x6F1 | 0x8A | 0x7C9 | 0xCA |
| data/25 | 0xED68 | 0x738 | 0x89 | 0x7EE | 0xC9 |
| data/24 | 0x76B4 | 0x3D4 | 0x88 | 0x775 | 0xC8 |
| data/23 | 0x3B5A | 0x1AA | 0x87 | 0x73B | 0xC7 |
| data/22 | 0x1DAD | 0x05D | 0x86 | 0x71E | 0xC6 |
| data/21 | 0x86C6 | 0x4E6 | 0x85 | 0x784 | 0xC5 |
| data/20 | 0x4363 | 0x2B3 | 0x84 | 0x742 | 0xC4 |
| data/19 | 0xA9A1 | 0x551 | 0x83 | 0x7AA | 0xC3 |
| data/18 | 0xDCC0 | 0x660 | 0x82 | 0x7DC | 0xC2 |
| data/17 | 0x6E60 | 0x3B0 | 0x81 | 0x76C | 0xC1 |
| data/16 | 0x3730 | 0x190 | 0x80 | 0x737 | 0xC0 |
| crc/15 | 0x1B98 | 0x0C8 | 0x9F | 0x71B | 0xDF |
| crc/14 | 0x0DCC | 0x06C | 0x9E | 0x70E | 0xDE |
| crc/13 | 0x06E6 | 0x0F6 | 0x9D | 0x704 | 0xDD |
| crc/12 | 0x0373 | 0x0B3 | 0x9C | 0x703 | 0xDC |
| crc/11 | 0x89A9 | 0x459 | 0x9B | 0x78A | 0xDB |
| crc/10 | 0xCCC4 | 0x664 | 0x9A | 0x7CC | 0xDA |
| crc/9 | 0x6662 | 0x3B2 | 0x99 | 0x764 | 0xD9 |
| crc/8 | 0x3331 | 0x191 | 0x98 | 0x733 | 0xD8 |
| crc/7 | 0x9188 | 0x448 | 0x97 | 0x792 | 0xD7 |
| crc/6 | 0x48C4 | 0x264 | 0x96 | 0x748 | 0xD6 |
| crc/5 | 0x2462 | 0x132 | 0x95 | 0x724 | 0xD5 |
| crc/4 | 0x1231 | 0x091 | 0x94 | 0x711 | 0xD4 |
| crc/3 | 0x8108 | 0x408 | 0x93 | 0x782 | 0xD3 |
| crc/2 | 0x4084 | 0x244 | 0x92 | 0x740 | 0xD2 |
| crc/1 | 0x2042 | 0x122 | 0x91 | 0x720 | 0xD1 |
| crc/0 | 0x1021 | 0x011 | 0x90 | 0x710 | 0xD0 |

FIG. 4

CIRCUIT AND METHOD FOR ERROR DETECTION

FIELD OF THE INVENTION

The present invention generally relates to circuitry for detecting errors using error correcting codes.

BACKGROUND

Error correcting codes (ECCs) may be used to detect and in some cases correct errors introduced into data. Data may be corrupted during transmission and/or storage of the data to imperfect media. One frequently used ECC is a block code in which each block of data is protected by an ECC value generated from the block of data. Following transmission and/or storage of the block of data together with the ECC value, the block of data may be checked by an ECC check to detect corruption of the data. Certain detected errors may be corrected by using the ECC.

Data corruption by a typical transmission and/or storage media may generally be limited to a small portion of a block of data, such as a single bit of the data. An ECC check may determine from the block of data and the corresponding ECC value that the data is correct, the data has a single bit or other small amount of corruption that may be identified for correction, or that the data has corruption that cannot be corrected.

One class of ECC is a cyclic redundancy check (CRC) such as CRC-CCITT. In certain applications, CRC is used to detect corruption of large blocks of data without the possibility of correcting any detected corruption. CRC may also be used in other applications to detect errors and correct certain errors in smaller blocks of data. For example, CRC-CCITT may be used to detect many errors in blocks of data with 16 bits and to correct single bit errors detected in the 16-bit block of data.

Many ECCs were initially developed for relatively low-speed serial data communication and have efficient implementations using linear feedback shift registers for error detection and correction. Many data communication applications, including high-speed serial data communication, have data rates that exceed the processing rate possible using linear feedback shift registers. Circuits are needed that can detect and/or correct corruption of data at data rates that exceed the processing rate possible using linear feedback shift registers. In addition, circuits are needed that reduce the amount of logic necessary to detect and/or correct corruption of data at these high data rates.

The present invention may address one or more of the above issues.

SUMMARY OF THE INVENTION

Various embodiments of the invention provide a circuit for detecting corruption of data using an error correcting code (ECC). The circuit includes an ECC checker, a memory arrangement, and a detection circuit. The ECC checker is adapted to generate a remainder of an ECC check of the data and an ECC value generated from an uncorrupted version of the data. The memory is configured with a set of values and arranged to receive a first portion of the remainder at a first address port and a second portion of the remainder at a second address port. The memory arrangement is adapted to output a first value of the set responsive to a value of the first portion and output a second value of the set responsive to a value of the second portion. The detection circuit is adapted to generate an error indication in response to the first and second values. The error indication includes a single-bit-error indicator that indicates whether a single bit of the data is incorrect.

Various other embodiments of the invention provide method for detecting corruption of data using an error correcting code (ECC). A remainder of a ECC check of the data and an ECC value generated from an uncorrupted version of the data. A first value of a set of values addressed by a first portion of the remainder is read from a memory arrangement. A second value of the set of values addressed by a second portion of the remainder is read from the memory arrangement. Whether the data has one bit that is incorrect is determined from the first and second values.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 4 is a table illustrating values used to initialize a memory arrangement used for detection of data corruption, in accordance with various embodiments of the invention;

DETAILED DESCRIPTION

Figure 1:
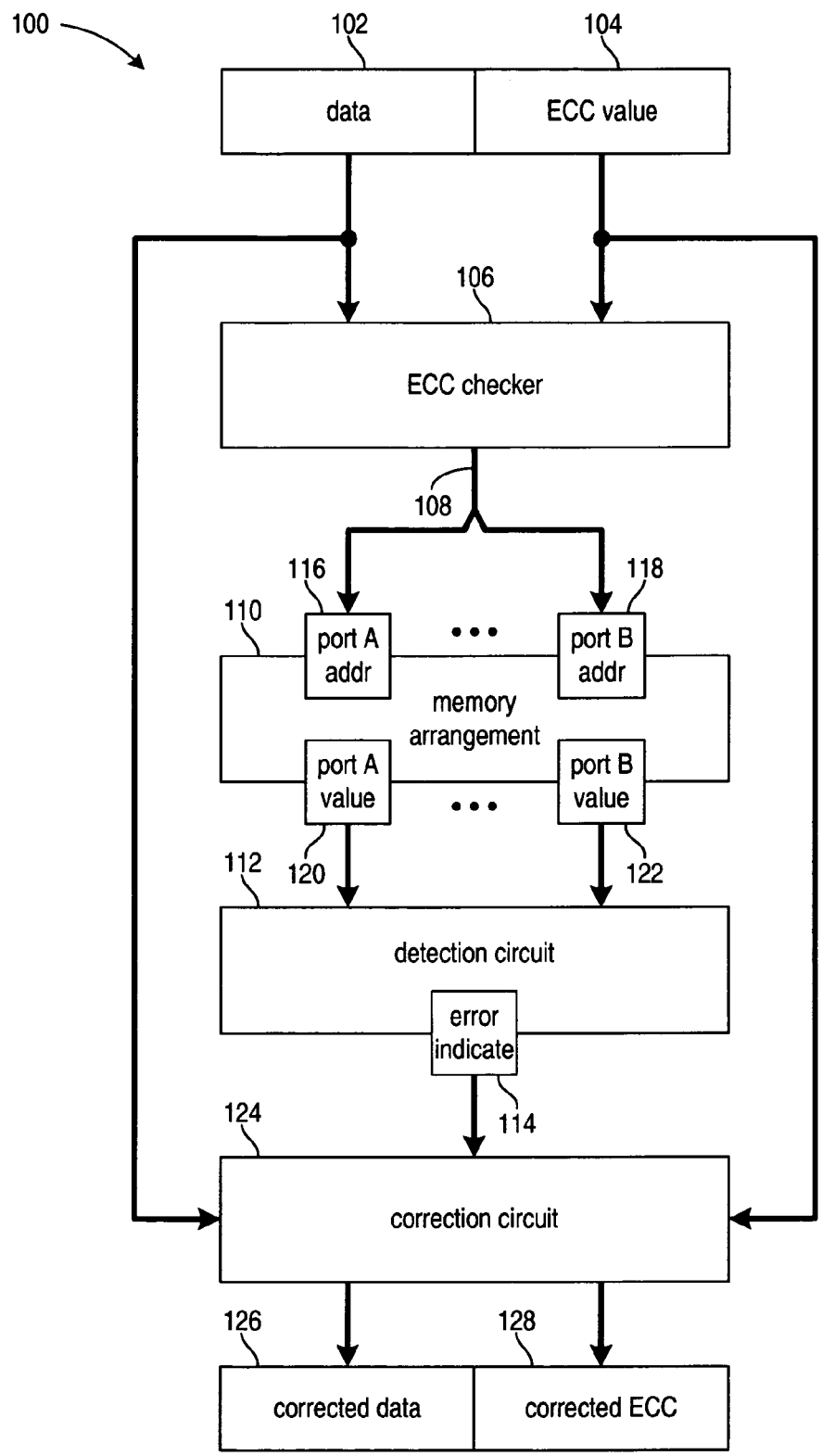
FIG. 1 is a block diagram of a circuit for detection and optional correction of data corruption, in accordance with various embodiments of the invention.

FIG. 1 is a block diagram of a circuit 100 for detection and optional correction of data corruption, in accordance with various embodiments of the invention. Data 102 may or may not be corrupted and data 102 is checked for corruption using ECC value 104. ECC value 104 may be generated from an uncorrupted version of data 102 using a systematic ECC code. In one embodiment, ECC value 104 may be generated from an uncorrupted version of data 102 using polynomial division of polynomial representing the uncorrupted version of data 102 by a characteristic polynomial for a CRC.

In an example usage, the uncorrupted version of data 102 and an ECC value generated from the uncorrupted version of data 102 are transmitted together over a high-speed communication channel (not shown) that may introduce errors in the received data 102 and/or the received ECC value 104. Circuit 100 in a receiver may detect corruption of the data 102 and/or the ECC value 104 received from the high-speed communication channel. Optionally, circuit 100 may correct certain types of corruption of the data 102 and/or the ECC value 104. For example, circuit 100 may correct corruption of the data 102 that has a single bit that is incorrect.

An ECC checker 106 calculates a remainder on line 108 from the possibly corrupted data 102 and the possibly corrupted ECC value 104. The ECC checker 106 may check for corruption of data 102 and/or ECC value 104 by calculating the remainder on line 108 as the syndrome from a parity check matrix operating on the data 102 and the ECC value 104. In one embodiment, the ECC checker 106 may check for corruption of data 102 and/or ECC value 104 using polynomial division by the characteristic polynomial for the CRC used to generate ECC value 104 from the uncorrupted version of data 102.

In one embodiment, the remainder on line 108 is generated by a polynomial division of a polynomial representing the combination of the data 102 and the ECC value 104 by the characteristic polynomial. For example, ECC value 104 may be a CRC value generated by shifting a polynomial representing the uncorrupted version of the data 102 by the degree of the characteristic polynomial and dividing the shifted result by the characteristic polynomial. The polynomial representing the combination of the data 102 and the ECC value 104 may be the sum of a polynomial representing the ECC value 104 and a polynomial that is a shifting, by the degree of the characteristic polynomial, of a polynomial representing the data 102. An example embodiment uses CRC-CCITT.

In another embodiment, polynomial division of a polynomial representing the data 102 by the characteristic polynomial for the CRC is used to generate an intermediate result. A bit-wise exclusive-or between the intermediate result and the ECC value 104 may be used to generate the remainder on line 108. It will be appreciated that ECC checker 106 may accomplish polynomial division by a characteristic polynomial using circuits having parallel exclusive-or trees each receiving selected bits of the data 102 and the ECC value 104 that are dependent upon the characteristic polynomial. At high data rates, such parallel exclusive-or trees are generally used to generate the remainder on line 108.

A value of zero for the remainder on line 108 may indicate that the data 102 is not corrupted. Generally, when either the data 102 of the ECC value 104 has a specific single bit that is incorrect, the remainder on line 108 has a corresponding value that is independent from the actual value for the uncorrupted version of the data 102. For example, an uncorrupted version of 16-bit data 102 of 0x0000 (hexadecimal) has a 16-bit CRC value of 0x0000 when CRC-CCITT is used. When data 102 is corrupted to 0x8000 (most significant bit of data 102 is inverted) and the CRC value remains uncorrupted, then the remainder on line 108 is 0xDD38. Similarly, when an uncorrupted version of 16-bit data 102 of 0xAAAA with a CRC value of 0xE615 has data 102 corrupted to 0x2AAA (most significant bit of data 102 is inverted) and the CRC value remains uncorrupted, then the remainder on line 108 is again 0xDD38.

In existing circuits, a look-up table or an array of comparators can be used to convert the value for a remainder into an indication of any error. However, the look-up table is generally large and conversion may be slow using a large look-up table. For example, a look-up table for a 16-bit CRC may require 16,384 entries in the look-up table, and the vast majority of these 16,384 entries are a default value. In addition, an array of comparators may require a substantial amount of logic. In contrast, various embodiments of the invention use a small look-up table in memory arrangement 110 and a small amount of logic in detection circuit 112 to convert the value for the remainder on line 108 into an error indication 114. The error indication 114 may include a specification of the type of error, such as a single bit error in a particular bit of the data 102 or the ECC value 104.

Memory arrangement 110 has two input ports 116 and 118 that each receive respective portions of the remainder on line 108. Generally, each bit of the remainder on line 108 is received by one or the other of input ports 116 and 118, and some bits of the remainder on line 108 may be received by both input ports 116 and 118. In addition, a portion of either or both of input ports 116 and 118 may be tied to a constant value. Memory arrangement 110 outputs a value 120 that is addressed by input port 116 and memory arrangement 110 outputs a value 122 addressed by input port 118.

In one embodiment, memory arrangement 110 is a dual port memory having one read port with address input port 116 and data output port 120 and another read port with address input port 118 and data output port 122. The dual port memory contains a set of values that may be read either by an address at input port 116 or by an address at input port 118. To provide sufficient information to the detection circuit 112, some bits of the remainder on line 108 are received by both input ports 116 and 118. However, each input port 116 and 118 receives less than all of the bits of the remainder on line 108. Thus, the look-up table of memory arrangement 110 is reduced in size from the look-up table of an existing circuit that has a single address input port receiving the entire remainder on line 108.

In another embodiment, memory arrangement 110 is two separate parallel memories. One memory receives an address at input port 116 and outputs data at output port 120 and the other memory receives an address at input port 118 and outputs data at output port 122. Together the memories contain a set of values and two values of the set of values are provided to detection circuit 112 from output ports 120 and 122. While using a dual port memory for memory arrangement 110 allows a particular value of the set of values to be output at either output port 120 or output port 122, using parallel memories for the memory arrangement 110 eliminates such collisions. In addition, using parallel memories for memory arrangement 110 may permit reducing the number of entries in the set of values and/or reducing the data width of each value of the set of values. However, using a dual port memory for memory arrangement 110 may be preferable in certain embodiments, such as an embodiment implementing circuit 100 in a programmable logic device (PLD) that has block memory that is capable of implementing dual port memory.

The two values from the set of values in memory arrangement 110 are used by detection circuit 112 to generate an error indication 114. Detection circuit 112 receives non-zero values from both ports 120 and 122 for a remainder on line 108 that corresponds to data 102 and ECC value 104 that have at most a limited number of bits that are incorrect. The non-zero values received may be used to ascertain that the remainder on line 108 does indeed correspond to data 102 and ECC value 104 that have at most a limited number of bits that are incorrect. In addition, the non-zero values received may be used by the detection circuit 112 to determine the number of bits that are incorrect and to specify an index of each of the bits that are incorrect.

The error indication 114 from detection circuit 112 may be used by optional correction circuit 124 to correct the possibly corrupted data 102 and/or ECC value 104. For example, detection circuit 112 may generate an error indication 114 that includes an indicator of whether the data 102 has a single bit that is incorrect and an index in the data 102 of any single bit that is incorrect. The correction circuit 124 may generate the corrected data 126 by inverting the bit at this index in the data 102 when the indicator indicates that the data 102 has a single bit that is incorrect. For scenarios having uncorrupted data 102 or more than a single bit of the data 102 that is incorrect, the correction circuit 124 may generate corrected data 126 that is identical to the data 102. Generally, the corrected data 126 is identical to the uncorrupted version of the data 102 when the combination of the data 102 and the ECC value 104 has at most a specific limited number of bits that are incorrect.

The corrected ECC 128 may be similarly generated by inverting up to a limited number of bits that are incorrect. However, in certain applications correction of the ECC value 104 is unneeded because the purpose of the ECC value 104 is to permit detection and optional correction of corruption in the data 102.

Figure 2:
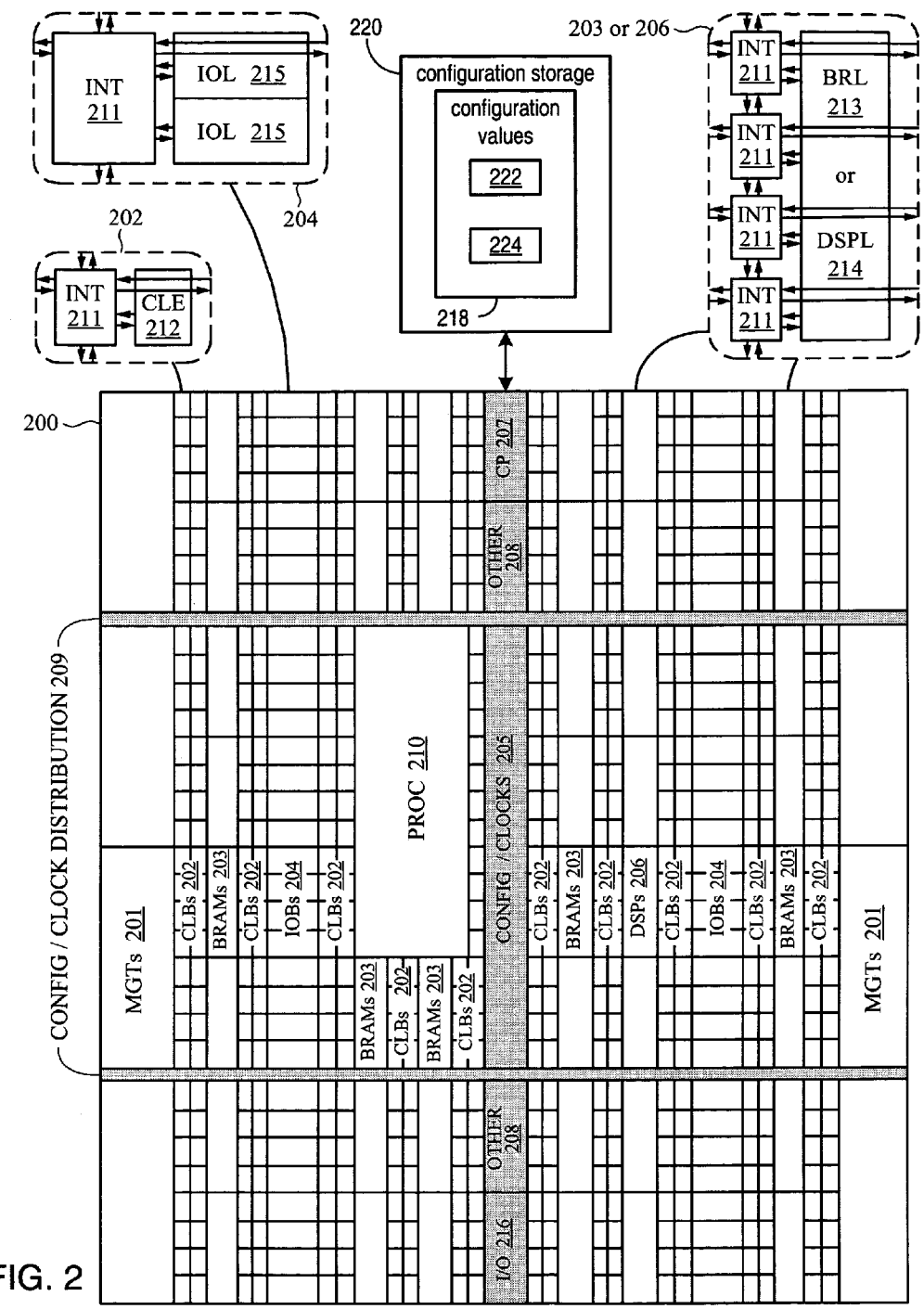
FIG. 2 is block diagram of a programmable logic device (PLD) configured in accordance with various embodiments of the invention.

FIG. 2 illustrates the architecture of an example FPGA 200 that includes a large number of different programmable resources, such as resources 201 through 204. The programmable resources of FPGA 200 may be programmed with configuration values 218 from configuration storage medium 220 to implement a wide variety of functions including the circuit 100 of FIG. 1. The configurable resources of FPGA 200 are arranged in columns of tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), configuration port (CP 207), specialized input/output block (I/O 216) (e.g., clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a single programmable interconnect element (INT 211) and a configurable logic element (CLE 212) that can be programmed to implement user logic, such as a portion of detection circuit 112 of FIG. 1. A BRAM 203 can include a BRAM logic element (BRL 213) in addition to one or more programmable interconnect elements. One or more of the BRL 213 may be used to implement the memory arrangement 110 of FIG. 1. The number of interconnect elements included in a tile may depend on the height of the tile. In the pictured embodiment, a BRAM tile has the same height as four CLBs, but other numbers (e.g., five) can also be used.

A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, more than one adjacent column of CLBs may be included wherever the CLBs appear to facilitate the efficient implementation of user logic. It will be appreciated that PLDs having different layouts of CLBs, IOBs, and interconnect circuitry (and the functional equivalents thereof) may also implement the various embodiments of the invention described herein.

A PLD, such as FPGA 200, may be programmed to implement some or all of the circuit 100 of FIG. 1 along with other functions. In addition, the ECC checker 106 of FIG. 1 may be implemented by dedicated logic internal to certain resources, such as MGTs 201. In one embodiment, FPGA 200 is programmed such that certain MGTs 201 are configured to implement an external high-speed communication channel. Data received by FPGA 200 from the communication channel may be corrupted by the communication channel. To protect the data from corruption, an ECC value, such as a CRC value, may be remotely generated from the data before the data and the ECC value are transferred to the FPGA 200 by the communication channel. Various embodiments of the invention may program FPGA 200 to detect and potentially correct any corruption of the received data using the received ECC value.

The MGTs 201 and IOBs 204 may be configurable to support external communication using various communication standards, including configurable drive strengths and configurable drive levels. CLBs 202 may each include a look-up table that may be configured to implement any logic function that has up to 4-bits of input data and 1-bit of output data. The programmable interconnect elements 211 may be configurable to allow various interconnections between the MGTs 201, IOBs 204, CLBs 202, and BRAMs 203. The BRAMs 203 may be configurable to implement memory of various types, such as dual or single port RAM or read-only memory (ROM) of various sizes and data widths having either synchronous or asynchronous interfaces. In addition, BRAMs 203 may be configurable with a set of values for the initial contents of the BRAMs.

The FPGA 200 may be programmed with configuration values 218 from configuration storage medium 220. Examples for configuration storage medium 220 include serial programmable read-only memory (PROM), parallel flash PROM, magnetic or optical storage, such as magnetic or optical storage of a general purpose computer, and other computer readable media.

The configuration values 218 may include a logic configuration 222 that configures certain resources, such as certain CLBs 202 and certain INTs 211, to implement the detection circuit 112 of FIG. 1. The configuration values 218 may also include a memory configuration 224 that configures certain BRAMs 203 to implement the memory arrangement 110 of FIG. 1, including providing a set of values for the contents of these memory resources. In one embodiment, BRAMs 203 are dual port RAMs providing 16,384 bits of storage and memory arrangement 110 of FIG. 1 is one of these BRAMs 203 configured to contain a set of 2048 values with each value having 8-bits of data width. The detection circuit may read from the memory arrangement respective values addressed by a first portion and a second portion of a remainder. The detection circuit may generate an error indication as a function of these respective values, and the error indication may include a single bit error indicator that indicates a single bit of the data is incorrect.

Figure 3:
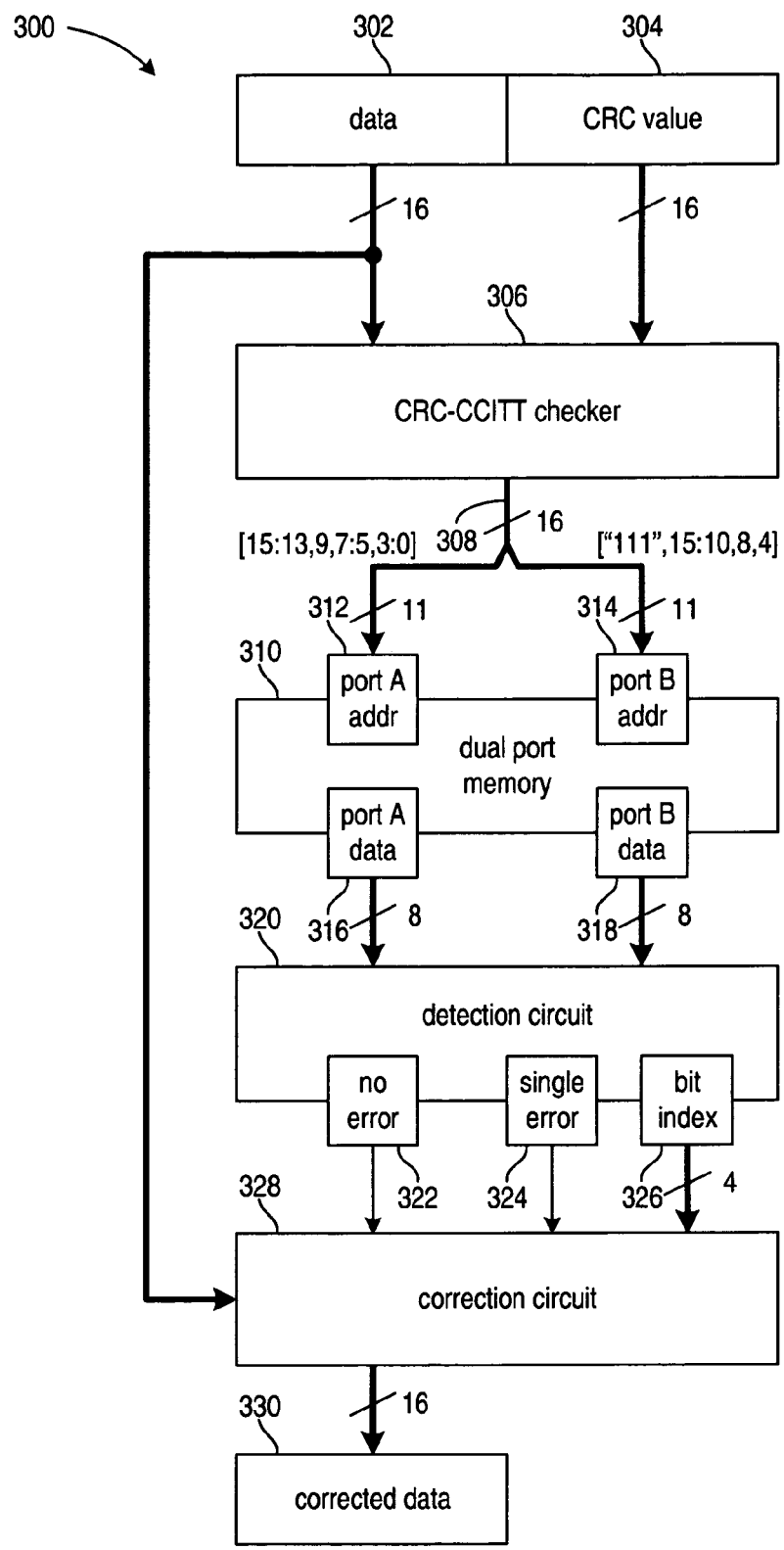
FIG. 3 is a block diagram of a circuit using CRC-CCITT for detection and potential correction of data corruption, in accordance with various embodiments of the invention.

FIG. 3 is a block diagram of a circuit 300 using CRC-CCITT for detection and potential correction of data corruption, in accordance with various embodiments of the invention. The possibly corrupted data 302 may have 16-bits and a CRC value 304 generated according to CRC-CCITT has 16-bits. CRC checker 306 generates the 16-bit remainder on line 308 from data 302 and CRC value 304 according to the standards for CRC-CCITT. Circuit 300 may detect and correct corruption of the data 302 and the CRC value 304 that is limited to one bit that is incorrect in one of the data 302 and the CRC value 304. Circuit 300 may also ascertain that the data 302 and the CRC value 304 are uncorrupted or that more than one bit is incorrect in the data 302 and the CRC value 304.

The value of zero for the remainder on line 308 corresponds to an uncorrupted data 302 and an uncorrupted CRC value 304. Sixteen values of the remainder correspond to exactly one of the sixteen bits of the data 302 being incorrect while the CRC value 304 is uncorrupted and another sixteen values of the remainder correspond to exactly one of the sixteen bits of the CRC value 304 being incorrect while the data 302 is uncorrupted. Circuit 300 may distinguish these thirty-three particular values of the remainder (denoted the "valid" values of the remainder and shown in column 402 of FIG. 4) from the 16,351 possible other values for the remainder, which correspond to the data 302 and the CRC value 304 having at least two bits that are incorrect. In addition, circuit 300 may distinguish these thirty-three valid remainder values from each other.

In one embodiment, of the 16-bits of the remainder on line 308, the 11-bit portion of the remainder including bit-15 through bit-13, bit-9, bit-7 through bit-5, and bit-3 through bit-0 is received by dual port memory 310 at address port 312. Various other embodiments provide other portions of the remainder to address port 312. The 11-bit portion of the remainder received at address port 312 may address one of a set of 2048 values in the dual port memory 310. The bits included in the 11-bit portion of the remainder are selected such that the 11-bit portion of the remainder has a unique value for each of the valid remainder values. The unique value for the 11-bit portion ensures that two valid remainder values do not collide by addressing the same entry at address port 312 of the dual port memory 310. For example, one possible single bit error has a valid remainder value of 0xDD38 (hexadecimal), and the corresponding value of the 11-bit portion of the remainder discussed above is 0x618. Of the thirty-three valid remainder values, only the remainder of 0xDD38 has the 11-bit portion of 0x618.

In one embodiment, the portion of the remainder on line 308 connected to address port 314 includes the leftover bits that are not used at the address port 312, including bit-12 through bit-10, bit-8, and bit-4. However, these five bits alone are insufficient to prevent a collision between valid remainder values at address port 314 of dual port memory 312. The three additional bits of bit-15 through bit-13 are received at address port 314 in addition to being received at address port 312 to prevent a collision at address port 314 between valid remainder values.

Selecting the eleven bits bit-15 through bit-13, bit-9, bit-7 through bit-5, and bit-3 through bit-0 for address port 312 prevents an address collision at address port 312 for the thirty-three valid remainder values and selecting the eight bits bit-15 through bit-10, bit-8, and bit-4 prevents an address collision at address port 314 for the thirty-three valid remainder values. However, an additional collision is possible where an address at address port 312 collides with an address at address port 314. For example, if the upper three bits of address port 314 are each tied to a zero-value and the remaining eight bits of address port 314 and the eleven bits of address port 312 are connected in the above-listed orders, then the same location may be addressed in dual port memory 310 at ports 312 and 314 for some of the thirty-three valid remainder values. When the upper three bits of address port 314 are instead each tied to a one-value, such a collision does not occur between address port 312 and address port 314. It will be appreciated that in another embodiment using parallel memories instead of dual port memory 310, collision is not possible between ports.

The contents of dual port memory 310 are a set of values that are non-zero "valid" values for the sixty-six locations that are addressed by either address port 312 or by address port 314 for the thirty-three valid remainder values. Locations in dual port memory 310 that are addressed neither by address port 312 nor by address port 314 for any of the valid remainder values have a value of zero. Thus, when a specific remainder on line 308 causes a zero-value to be read at data output port 316 or causes a zero-value to be read at data output port 318, the detection circuit 320 can immediately determine that the remainder is not one of the valid remainder values and consequently that the data 302 and CRC value 304 have more than one bit that is incorrect. However, certain values of the remainder, which are distinct from the thirty-three valid remainder values, may cause a non-zero value to be read at both of data output ports 316 and 318. When non-zero values are read at both data output ports 316 and 318, the specific non-zero values read are examined to determine whether the remainder on line 308 is one of the valid remainder values.

In one embodiment, the values in dual port memory 310 are 8-bit values (for example, bram_out[7:0]) that may be output at either data port 316 or data port 318. An example dual port memory is a block random access memory (BRAM) in the Virtex 2 or Virtex 4 FPGA from Xilinx, Inc. of San Jose, Calif., where a FPGA is a type of PLD. Each value in dual port memory 310 contains five bit fields denoted "match" (bram_out[7]), "port" (bram_out[6]), "zero" (bram_out[5]), "data/crc" (bram_out[4]), and "index [3:0]" (bram_out[3:0]). The "match" field is a 1-bit field that makes the valid values in dual port memory 310 have a non-zero value regardless of the values of the other fields. If either match field read from data port 316 or data port 318 has a value of zero, then the remainder on line 308 is not one of the valid remainder values. When both match fields read from data port 316 and data port 318 have a value of one, the remainder on line 308 could potentially match one of the valid remainder values.

Because dual port memory 310 has two read ports, a valid value that is intended to be addressed by input port 312 and output at data port 316 may instead be addressed by input port 314 and output at data port 318, and vice versa. This "crossover" causes certain of the scenarios having a non-zero value provided from both data ports 316 and 318 even though the remainder on line 308 is not one of the valid remainder values. The "port" field is a 1-bit field that has a zero-value for valid values in dual port memory 310 that are intended to be read at data port 316, and a one-value for valid values that are intended to be read at data port 318. The port field may be checked to determine whether crossover has occurred.

When the value output at data port 316 has a match field with a one-value and a port field with a zero-value, the portion of the remainder 308 received at address port 312 corresponds to the portion of one of the valid remainder values. Similarly, when the value output at data port 318 has a match field with a one-value and a port field with a one-value, the portion of the remainder 308 received at address port 314 corresponds to the portion of one of the valid remainder values. The valid remainder values correspond to at most the one bit that is incorrect in the data 302 and the CRC value 304.

The "zero" field is a 1-bit field that has a one-value only for the two valid values in dual port memory 310 that correspond to the valid remainder value of 0x0000. The zero field may be checked to determine whether the remainder on line 308 is zero-valued corresponding to the absence of corruption of data 302 and CRC value 304. When the value output at either data port 316 or data port 318 has a "zero" field with a zero-value, the remainder on line 308 is non-zero and the data 302 and CRC value 304 have at least one bit that is incorrect.

The "data/crc" field is a i-bit field that indicates for the non-zero valid remainder values whether the one bit that is incorrect is in the data 302 or in the CRC value 304. The data/crc field has a zero-value when the data 302 includes the one bit that is incorrect and a one-value when the CRC value 304 includes the one bit that is incorrect. The "index [3:0]" field is a 4-bit field that identifies for the non-zero valid remainder values which of the 16-bits in the data 302 is incorrect or which of the 16-bits in the CRC value 304 is incorrect.

The detection circuit 320 uses the information received from data output ports 316 and 318 to generate an error indication that may including no-error indicator 322, single-bit error indicator 324, and erroneous bit index 326. In one embodiment, no-error indicator 322 indicates all bits of the data 302 are correct. In another embodiment, no-error indicator 322 indicates all bits of data 302 and all bits of CRC value 304 are correct. In one embodiment, single-bit error indicator 324 indicates the data 302 has one bit that is incorrect. In another embodiment, single-bit error indicator 324 indicates the CRC value 304 has one bit that is incorrect. In yet another embodiment, single-bit error indicator 324 indicates that one of data 302 and CRC value 304 has one bit that is incorrect. It will be appreciated that a multiple-bit-error indicator that indicates multiple bits are incorrect in the data 302 and CRC value 304 may be provided by a combination of the absence of indications from no-error indicator 322 and single-bit error indicator 324. The bit index 326 may identify the bit, if any, that is incorrect in the data 302 and/or the CRC value 304.

Correction circuit 328 may generate corrected data 330 from data 302 by inverting the bit identified by bit index 326 when single-bit error indicator 324 indicates the presence of one bit that is incorrect. Otherwise, correction circuit 328 may generate corrected data 330 that is identical to data 302.

FIG. 4 is a table illustrating values used to initialize a memory arrangement used for detection of data corruption, in accordance with various embodiments of the invention. Column 402 contains the thirty-three valid remainder values. Row 404 corresponds to the valid remainder value for uncorrupted data and CRC value. The other rows correspond to valid remainder values for various single bit errors in one of the data and the CRC value. Column 406 indicates the bit of the data or the CRC value that is incorrect, if any. In one embodiment, a 32-bit value includes both the data and the CRC value and column 406 includes the index of the bit, if any, that is incorrect in the 32-bit value.

A portion, shown in column 408, of the valid remainder values in column 402 is used to address one port of a memory arrangement that may be a dual port memory. Column 410 shows the valid values of the set of values in the memory arrangement at the address of column 408. Similarly, another portion, shown in column 412, of the valid remainder values in column 402 is used to address another port of the memory arrangement. Column 414 shows the valid values in the memory arrangement at the address of column 412. In one embodiment, the portion shown in column 408 includes the eleven bits bit-15 through bit-13, bit-9, bit-7 through bit-5, and bit-3 through bit-0 of the valid remainder values in column 402. The portion shown in column 412 may include the eleven bits of three one-valued bits plus the eight bits of bit-15 through bit-10, bit-8, and bit-4 of the valid remainder values in column 402.

The non-zero values of the set of values in the memory arrangement are the sixty-six values shown in columns 410 and 414 at the address respectively shown in columns 408 and 412. All the other 1982 values of the set of values in the memory arrangement are zero-values for the addresses that are not shown in either column 408 or column 412. Each value in columns 410 and 414 may contain four 1-bit fields denoted "match", "port", "zero", "data/crc", and a 4-bit field denoted "index[3:0]" in that order from most significant to least significant.

In another embodiment (referring back to FIG. 3), dual port memory 310 contains a set of 4,096 values each having 4-bits of data width. Address ports 312 and 314 receive respective portions of the remainder on line 308 that both include the eight bits bit-15 through bit-10, bit-8, and bit-4, or another combination of eight bits of the remainder that ensures a unique value for these eight bits for any of the thirty-three valid remainder values. Because of the unique value for these eight bits for the valid remainder values, collisions do not occur at either address port 312 or address port 314. The other eight bits of the remainder are split between the address ports 312 and 314 such that a collision does not occur between address port 312 and address port 314 for any of the non-zero valid remainder values. For example, address port 312 may receive the 12-bit portion of the remainder on line 308 of bit-15 through bit-10, bit-8, and bit-4 together with bit-7, bit-5, bit-1, and bit-0 in that order and address port 314 may receive the 12-bit portion of bit-15 through bit-10, bit-8, and bit-4 together with bit-9, bit-6, bit-3, and bit-2 in that order.

For the zero-valued valid remainder corresponding to uncorrupted data 302 and CRC value 304, both address ports 312 and 314 receive an address of zero. Address zero of dual port memory 310 contains a "valid" value that is non-zero. Dual port memory 310 also contains non-zero "valid" values for the sixty-four locations that are addressed by either address port 312 or by address port 314 for the thirty-two non-zero valid remainder values. Thus, dual port memory contains a set of values that are zero-valued except for sixty-six valid values corresponding to the thirty-three valid remainder values.

When non-zero valid values are read from both data output port 316 and data output port 318, both portions of the remainder received at address port 312 and address port 314 are portions of respective valid remainder values. Because both address ports 312 and 314 receive eight bits (bit-15 through bit-10, bit-8, and bit-4) that uniquely identify each of the thirty-three valid remainder values, the value of these eight bits corresponds to the same one of the thirty-three valid remainder values.

Each data output port 316 and 318 can include a port field that is checked to determine whether crossover has occurred. In the absence of crossover, the remainder on line 308 is one of the thirty-three valid remainder values when non-zero values are read from both data output ports 316 and 318. The seven possible non-zero values of the remaining three bits from data port 316 may be combined with the seven possible non-zero values of the remaining three bits from data port 316 to specify which one of the thirty-three valid remainder values is the remainder value on line 308.

Figure 5:
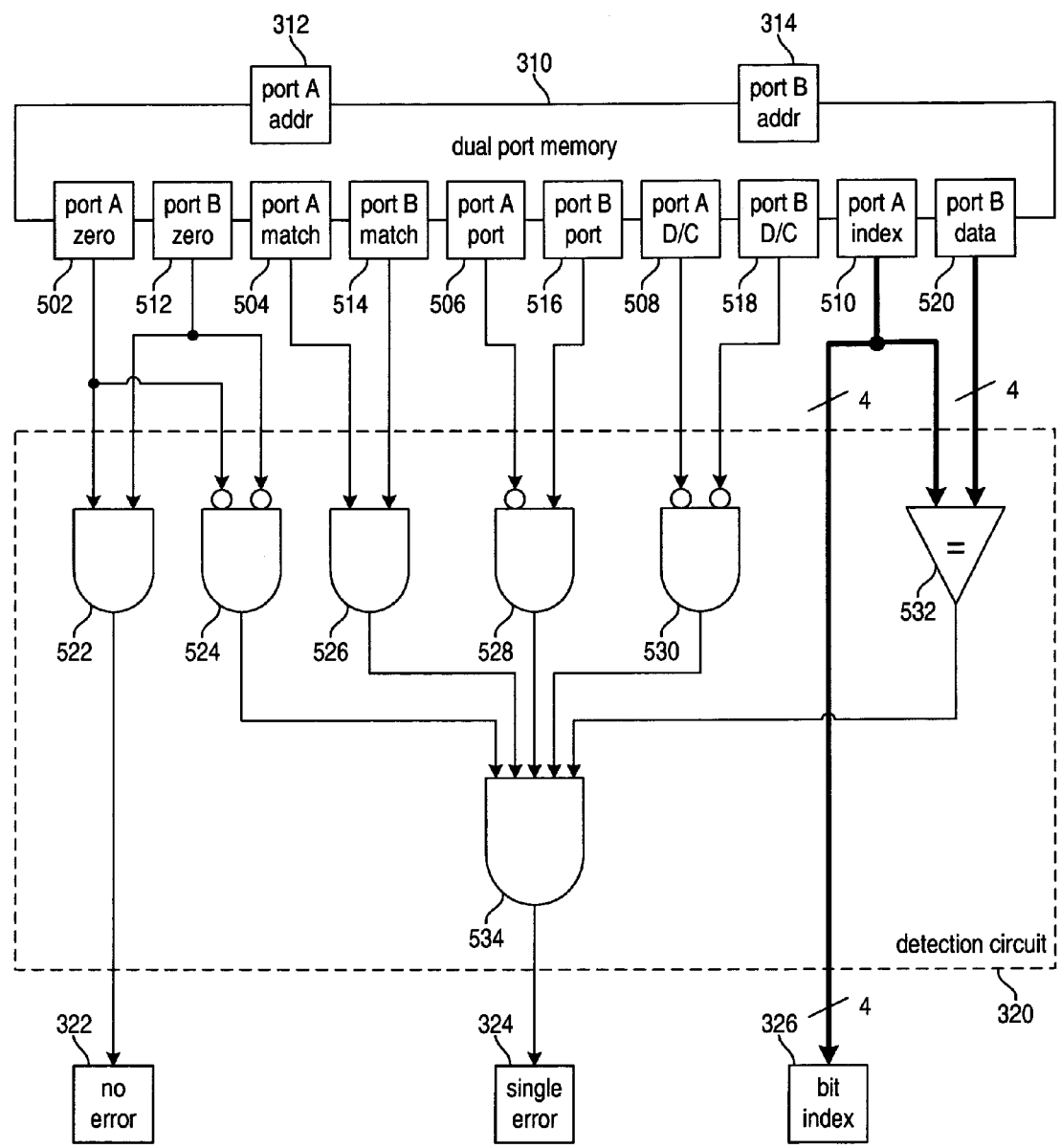
FIG. 5 is a block diagram of a circuit for detection of data corruption, in accordance with various embodiments of the invention.

FIG. 5 is a block diagram of a circuit for detection of data corruption, in accordance with various embodiments of the invention. Portions of a remainder are used to address dual port memory 310 at address port 312 and address port 314. The address at address port 312 reads the zero field 502, match field 504, port field 506, data/crc field 508, and index 510 from dual port memory 310. The address at address port 314 reads the zero field 512, match field 514, port field 516, data/crc field 518, and index 520 from dual port memory 310. The values read from the dual port memory 310 for these addresses are used by detection circuit 320 to generate a no-error indicator 322, a single-bit error indicator 324, and an erroneous bit index 326.

When a one-value is read from dual port memory 310 for both zero fields 502 and 512, the remainder corresponds to no corruption of the data and no corruption of the CRC value. Thus, AND gate 522 generates no-error indicator 322 from zero fields 502 and 512.

AND gate 524 generates an output indicating that the data and/or the CRC value has some corruption. AND gate 526 generates an output indicating that both portions of the remainder read one of the sixty-six valid values in the set of values contained in dual port memory 310. AND gate 528 generates an output indicating the absence of crossover between address ports 312 and 314. AND gate 530 generates an output indicating that the data, and not the CRC value, includes the bit, if any, that is incorrect. Comparator 532 generates an output indicating agreement on which bit, if any, is incorrect. AND gate 534 generates the single-bit error indicator 324 indicating that the data has one bit that is incorrect and bit index 326 identifies the bit of the data that is incorrect.

In various embodiments of the invention, a correction circuit corrects a single bit error in the data by inverting the value of the bit of the data identified by bit index 326 when single-bit error indicator 324 is asserted. In various other embodiments of the invention, other error indications are generated for certain purposes, such as logging the detection and/or correction of corruption. For example, removing the input of AND gate 534 received from the output of AND gate 530 generates an alternative single-bit error indicator 324 that indicates one bit is incorrect in one of the data and the CRC value. Such an indicator 324 may be useful for logging occurrences of single-bit errors that are successfully corrected.

Figure 6:
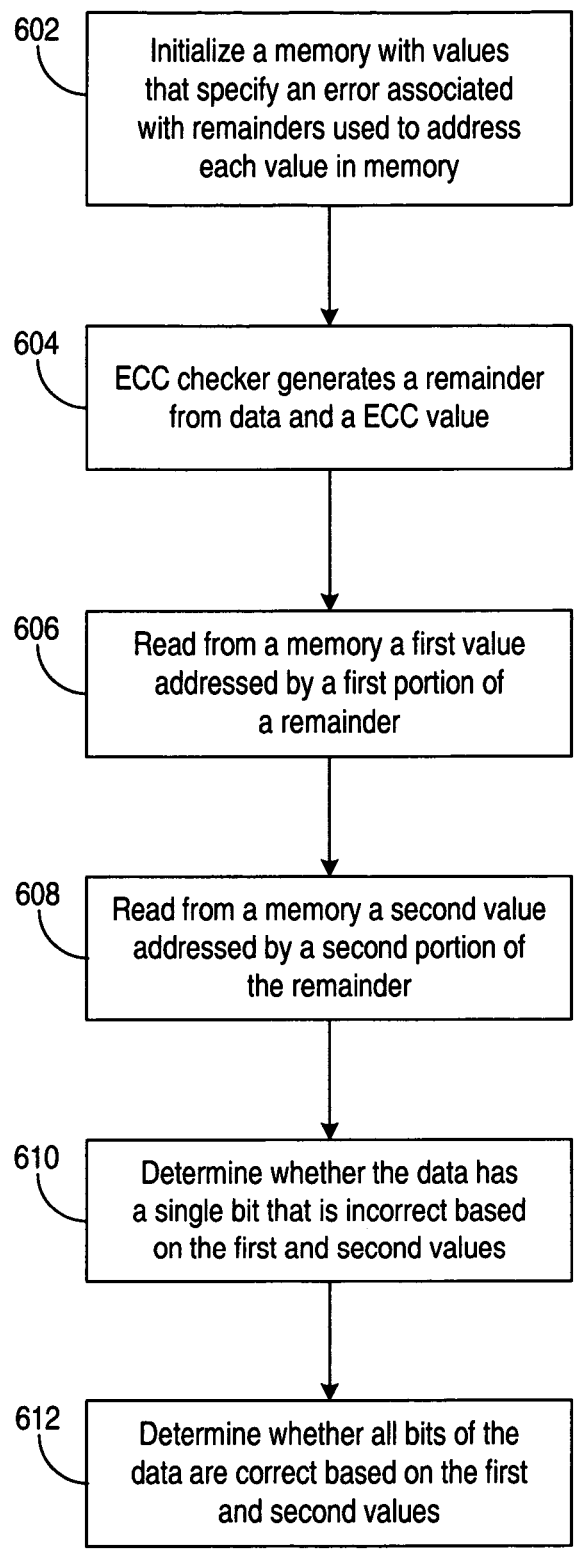
FIG. 6 is a flow chart of a process for detection of data corruption, in accordance with various embodiments of the invention.

FIG. 6 is a flow chart of a process for detection of data corruption, in accordance with various embodiments of the invention. At step 602, a memory arrangement, which may be a dual port memory or two parallel memories, is initialized with a set of values that specify any error in data and/or an associated ECC value. The associated ECC value is generated from an uncorrupted version of the data and may be a CRC value generated from an uncorrupted version of the data using a CRC. The ECC value may be remotely generated. At step 604, an ECC check generates a remainder from the possibly corrupted data and possibly corrupted ECC value. One portion of the remainder is used to address the memory arrangement at a first address port and another portion of the remainder is used to address the memory arrangement at a second address port.

At step 606, a first value that is addressed by a first portion of the remainder is read from the memory arrangement using the first address port. At step 608, a second value that is addressed by a second portion of the remainder is read from the memory arrangement using the second address port. At step 610, the first and second values are used to determine whether the data has a single bit that is incorrect. At step 612, the first and second values are used to determine whether all bits of the data are correct.

Various embodiments of the present invention are described in terms of configurable resources of a field programmable gate array (FPGA). Those skilled in the art will appreciate, however, that the invention could be implemented in different FPGA architectures, other types of programmable logic devices (PLDs) other than FPGAs, integrated circuits that include programmable logic circuitry and/or adapted to various application requirements, based on both volatile and non-volatile technologies.

The present invention is thought to be applicable to a variety of systems for error detection. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit for detecting corruption of data using an error correcting code (ECC), comprising:
   an ECC checker adapted to generate a remainder of an ECC check of the data and an ECC value generated from an uncorrupted version of the data;
   a memory arrangement coupled to the ECC checker, the memory arrangement configured with a set of values and arranged to receive a first portion of the remainder at a first address port and a second portion of the remainder at a second address port, wherein the memory arrangement is adapted to output a first value of the set responsive to a value of the first portion and output a second value of the set responsive to a value of the second portion; and
   a detection circuit coupled to the memory arrangement and adapted to generate an error indication in response to the first and second values, wherein the error indication includes a single-bit-error indicator that indicates whether a single bit of the data is incorrect.

2. The circuit of claim 1, wherein the ECC value is generated from a polynomial division of a polynomial representing the uncorrupted version of the data by a characteristic polynomial for a cyclic redundancy code (CRC), and the ECC checker is adapted to generate the remainder from a polynomial division by the characteristic polynomial of a polynomial representing the data and the ECC value.

3. The circuit of claim 1, wherein the ECC value is generated from a polynomial division of a polynomial representing the uncorrupted version of the data by a characteristic polynomial for a cyclic redundancy code (CRC), and the ECC checker is adapted to generate the remainder from the ECC value and a result of a polynomial division of a polynomial representing the data by the characteristic polynomial.

4. The circuit of claim 1, wherein the memory arrangement is a dual port memory.

5. The circuit of claim 1, wherein the memory arrangement is at least one block memory of a programmable logic device (PLD).

6. The circuit of claim 5, further comprising a configuration arrangement adapted to configure the at least one block memory with the set of values and configure logic and routing resources of the PLD, wherein the logic and routing resources of the PLD are arranged to implement the detection circuit.

7. The circuit of claim 1, wherein the memory arrangement includes a first memory arranged to receive the first portion of the remainder and adapted to output the first value of the set responsive to the value of the first portion and a second memory arranged to receive the second portion of the remainder and adapted to output the second value of the set responsive to the value of the second portion.

8. The circuit of claim 1, wherein the error indication further includes an index indicative of the single bit of the data that is incorrect.

9. The circuit of claim 8, wherein the data has 16 bits and the index identifies the single bit of the 16 bits of the data that is incorrect.

10. The circuit of claim 1, wherein the error indication further includes one or more of a no-error indicator that indicates whether all bits of the data and the ECC value are correct, a no-error indicator that indicates whether all bits of the data are correct, a single-bit-error indicator that indicates whether a single bit of the ECC value is incorrect, a single-bit-error indicator that indicates whether a single bit is incorrect in one of the data and the ECC value, and a multiple-bit-error indicator that indicates whether a plurality of bits are incorrect in the data and the ECC value.

11. The circuit of claim 1, wherein for each memory value of the set of values that is output from the memory arrangement, the memory value includes one or more of a value indicating a single bit error, a value specifying the one of the data and the ECC value that includes the single bit that is incorrect, an index indicative of the single bit that is incorrect in the one of the data and the ECC value, and a value distinguishing between the memory value output as the first value and the memory value output as the second value.

12. The circuit of claim 1, wherein the ECC is CRC-CCITT.

13. An article of manufacture, comprising:
a processor-readable storage medium containing a set of configuration values for programming a programmable logic device (PLD) having programmable resources to detect corruption of data using an error correcting code (ECC), the configuration values including,
a first set of values for configuring memory resources of the programmable resources of the PLD; and
a second set of values for programming logic and routing resources of the programmable resources of the PLD to read from the memory resources a first value that is addressed by a first portion of a remainder of an ECC check of data and an ECC value generated from an uncorrupted version of the data, read from the memory resources a second value that is addressed by a second portion of the remainder, and generate an error indication as a function of the first and second values, wherein the error indication includes a single-bit-error indicator that indicates whether a single bit of the data is incorrect.

14. A method for detecting corruption of data using an error correcting code (ECC), comprising:
generating a remainder of a ECC check of the data and an ECC value generated from an uncorrupted version of the data;
reading from a memory arrangement a first value of a set of values addressed by a first portion of the remainder;
reading from the memory arrangement a second value of a set of values addressed by a second portion of the remainder; and
determining whether the data has one bit that is incorrect in response to the first and second values.

15. The method of claim 14, wherein determining whether the data has one bit that is incorrect further includes determining an index indicative of the one bit in the data that is incorrect in response to the first and second values.

16. The method of claim 15, further comprising correcting the one bit that is incorrect in the data.

17. The method of claim 14, further comprising determining whether all bits of the data and the ECC value are correct in response to the first and second values.

18. The method of claim 14, further comprising determining whether a plurality of bits are incorrect in the data and the ECC value in response to the first and second values.

19. The method of claim 14, further comprising initializing the memory arrangement with the set of values, each memory value of the set of values including an index and a first, second, third, and fourth fields, wherein for each memory value that is read from the memory arrangement, the memory value includes the first field distinguishing between the memory value read as the first value and the memory value read as the second value, the second field indicating the data and the ECC value have at most the one bit that is incorrect, the third field indicating the data and the ECC value have at least the one bit that is incorrect, the fourth field specifying the one of the data and the ECC value that includes the one bit that is incorrect, and the index indicative of the one bit that is incorrect in the one of the data and the ECC value.

20. The method of claim 19, wherein determining whether the data has the one bit that is incorrect comprises:
determining, in response to the first and second fields of the first value, whether the first portion of the remainder corresponds to at most the one bit that is incorrect in the data and the ECC value;
determining, in response to the first and second fields of the second value, whether the second portion of the remainder corresponds to at most the one bit that is incorrect in one of the data and the ECC value;
determining, in response to the third field of the first and second values, whether the data and the ECC value have at least the one bit that is incorrect;
determining, in response to the fourth field of the first and second values, whether the one bit that is incorrect is in the data; and
determining, in response to the index of the first and second values, the index indicative of the one bit of the data that is incorrect.

* * * * *